United States Patent [19]

Chokhawala

[11] Patent Number: 5,559,656
[45] Date of Patent: Sep. 24, 1996

[54] IGBT SWITCHING VOLTAGE TRANSIENT PROTECTION CIRCUIT

[75] Inventor: Rahul S. Chokhawala, Phoenix, Ariz.

[73] Assignee: International Rectifier Corporation, El Segundo, Calif.

[21] Appl. No.: 392,233

[22] Filed: Feb. 22, 1995

Related U.S. Application Data

[63] Continuation-in-part of Ser. No. 40,212, Apr. 1, 1993, Pat. No. 5,444,591.

[51] Int. Cl.$^6$ ............................................. H02H 9/04
[52] U.S. Cl. ........................... 361/18; 361/111; 361/56; 361/91; 361/58
[58] Field of Search ..................... 361/18, 111, 86, 361/91, 56, 58

[56] References Cited

U.S. PATENT DOCUMENTS

| | | | |
|---|---|---|---|
| 4,719,531 | 1/1988 | Okado et al. | 361/18 |
| 4,893,158 | 1/1990 | Mihara et al. | 361/91 |
| 5,179,488 | 1/1993 | Rovner | 361/18 |

*Primary Examiner*—Todd DeBoer
*Attorney, Agent, or Firm*—Ostrolenk, Faber, Gerb & Soffen, LLP

[57] ABSTRACT

A circuit for preventing switching voltage transients from damaging the IGBT during short circuit shut off, utilizing electronic gate control which decrease the rate of fall of the gate voltage of the IGBT only when a short circuit condition is sensed, thereby avoiding any losses during normal switching operation. In a first embodiment, a considerably higher value of gate resistor is switched-in in series with the gate resistor during a short circuit condition. In a second embodiment, a considerably higher value of external capacitor is switched-in in parallel with the IGBT gate input capacitance during a short circuit condition.

6 Claims, 11 Drawing Sheets

ON-STATE VOLTAGE DROP IN VOLTS

PERMISSIBLE SHORT CIRCUIT TIME IN $\mu s$ $t_{sc} = f(1/I_{sc})$
$t_{sc} = f(1/V_g)$

VG IN VOLTS

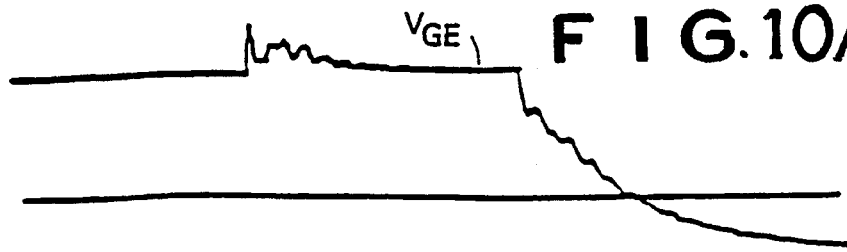
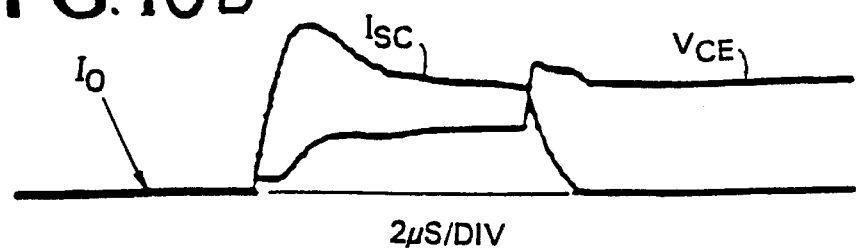
WITH RESISTIVE PROTECTIVE SCHEME
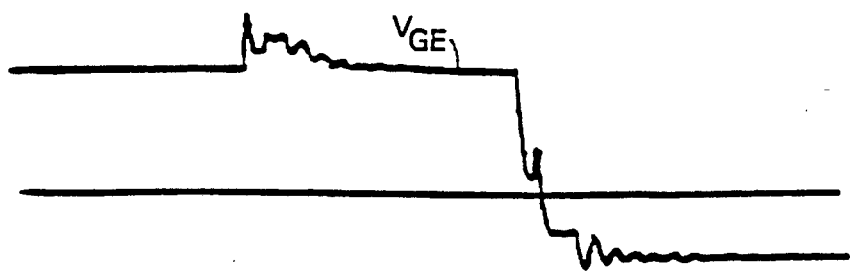
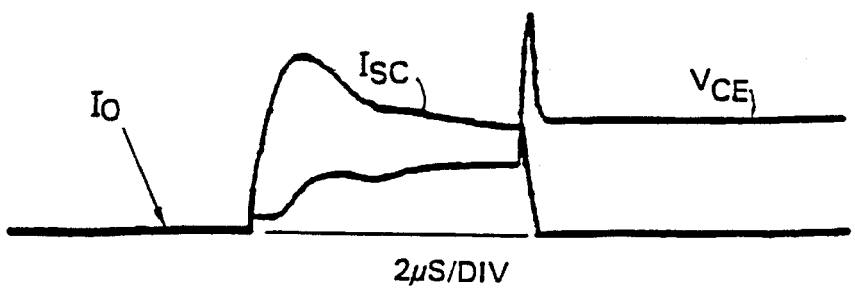
WITHOUT RESISTIVE PROTECTIVE SCHEME

1 μS/DIV

IGBT SWITCHING VOLTAGE TRANSIENT PROTECTION CIRCUIT

This is a continuation-in-part of application Ser. No. 08/040,212, filed Apr. 1, 1993, now U.S. Pat. No. 5,444,591.

BACKGROUND OF THE INVENTION

1. Field of the Invention

The present invention relates to a circuit for improving the short circuit withstand capability of an insulated gate bipolar transistor (IGBT) and preventing switching voltage transients from damaging the IGBT.

2. Description of the Related Art

Power transistors are used in electrical equipment to control and convert electrical power. The objective is achieved by switching these devices on and off, at predetermined instances. The devices are selected by system designers to reliably handle circuit currents under normal as well as estimated overload conditions. However, under fault or short circuit conditions, a device may be subjected to very high surge currents, the magnitude of which is limited mainly by its own gain. Only timely control and removal of fault current, by some external means, will save such device from failure.

In applications where system fault is very real, the motor-drive market being the prime example, external protection circuits are used to sense the fault and turn off the transistor by shutting down the base/gate drive. In all such applications, except where "intelligent" modules are used, the protection circuit is connected externally to the device.

Consequently, device manufacturers are expected to guarantee minimum short-circuit withstand time, which is a measure of how long a device will survive fault current. A device tradeoff exists between the short circuit withstand time and the current-gain of the power transistors. That is, the higher the gain of the transistor, the higher the fault current magnitude will be and the shorter the short circuit withstand time will be. The tradeoff, illustrated in FIG. 1, is more important for IGBT transistor manufacturers due to the inherently higher gain of these devices. The low-gain IGBTs available today allow longer short circuit time, but at the expense of operating efficiency. The high gain devices, on the other hand, boast greater efficiency, but require quicker external protection circuits.

The present market trend is to improve system efficiency. This, in turn, translates to demand for high efficiency IGBTs. The requirement for longer short circuit time (10 μs) is still prevalent, especially for the existing designs. There is thus a pressing need for high efficiency (higher gain), long short circuit time IGBTs. The inherent device tradeoff, however, does not allow IGBTs to have it both ways.

Prior solutions for protecting IGBTs have been devised, but are not entirely satisfactory. For example, the prior art circuit shown in FIG. 2 uses a current sense IGBT to monitor the IGBT current. If the device current exceeds the preset value, the voltage developed across the sense-resistor R rises above the MOSFET's gate-threshold level. As the MOSFET starts to conduct, a voltage drop is developed across external series gate resistor $R_G$. The IGBT gate voltage is accordingly reduced and the device current is regulated. The limitation of this circuit is that it can only be used with current-sense IGBTs. The cost effectiveness of manufacturing current-sense IGBTs and problems related to controlling tolerances in the current-sense ratio are major considerations. The vast majority of IGBTs used today in power modules are not of the current-sense type. Also, this circuit cannot be "plugged" externally to an IGBT module unless current-sense terminals are brought outside, a difficult task since this may render the circuit sensitive to system noise. Moreover, the circuit dependency on the value of $R_G$ compromises the IGBT turn-on losses.

The prior art circuit shown in FIG. 3 makes use of power ICs with a sense feature. The circuit monitors collector to emitter voltage to sense the fault. This circuit has built-in delays to allow for turn-on switching and narrow load current spikes. A fault condition lasting for longer than the above-described delay, however, is greeted with complete IGBT shutdown. The circuit has no provision to: 1) limit the initial high peak of fault current; or, 2) keep limiting the fault current, while restoring normal gate drive if the fault is of a short, transient type. The other disadvantage of this circuit is that it requires a DC voltage supply to operate. Thus, it cannot be simply inserted inside the existing modules.

Accordingly, a need exists for a circuit which improves the short circuit withstand capability of IGBTs without the above-noted disadvantages of the prior art.

Another problem with the recent development of high current, fast switching IGBT modules is that these modules may produce detrimental switching voltage transients. When a power transistor is suddenly turned off, trapped energy in the circuit produces stray inductance which is dissipated in the switching device, causing a voltage spike across the device. The magnitude of this transient voltage is proportional to the amount of stray inductance and the rate of the fall of the turn-off current. If a short circuit current is turned off too quickly, a destructive voltage transient is produced which could destroy the transistor.

Thus, there is also a need for a circuit which prevents switching voltage transients from destroying the high current IGBT during turn off of the IGBT under fault conditions.

SUMMARY OF THE INVENTION

The circuit of the present invention achieves the above-noted objectives. The circuit takes advantage of the fundamental characteristics of IGBTs, related to the dependency of short circuit withstand time on the gate voltage. As shown in FIG. 4, lowering the gate voltage to an IGBT lowers the magnitude of fault current and prolongs short circuit endurance time.

Accordingly, the circuit of the present invention operates by sensing the fault and subsequently lowering the gate voltage. Lower gate voltage limits magnitude of the fault current and in doing so extends the short circuit withstand time. A built-in time delay is introduced to allow for the switching transients or load current spikes.

Also, the circuit of the present invention advantageously protects the IGBT against fault current shut off transients by slowing the rate at which the fault current drops off.

More specifically, the circuit of the present invention utilizes electronic gate control to decrease the rate of fall of voltage at the gate of the IGBT only when a short circuit condition is sensed, thereby avoiding any losses during normal switching operations.

In a first embodiment of the present invention, a considerably higher value of gate resistor is switched-in in series with the gate resistor during a short circuit condition. A MOS transistor, preferably a P-MOSFET, connected across the additional resistor, is utilized to switch-in the additional resistor. The circuit turns off the P-channel MOSFET during a short circuit condition when the voltage at the collector of the IGBT rises, thereby electrically connecting the additional resistor in series with the gate drive resistor.

In a second embodiment of the present invention, a considerably higher value of additional capacitance is switched-in in parallel with the IGBT gate input capacitance during a short circuit condition. A MOS transistor, preferably a N-channel MOSFET, connected in series with an additional capacitor, is utilized to switch-in the additional capacitor. The circuit turns on the N-channel MOSFET during a short circuit condition when the voltage at the collector of the IGBT rises, thereby electrically connecting the additional capacitor in parallel with the IGBT gate input capacitance.

The functional usefulness of the circuit of the second embodiment can be increased by coupling a Zener diode in parallel with the additional capacitor, the Zener diode clamping the gate voltage of the IGBT to a predetermined voltage when the N-channel MOSFET is turned on during a short circuit condition, thereby limiting fault current amplitude.

Other features and advantages of the present invention will become apparent from the following description of the preferred embodiments with reference to the accompanying drawings.

BRIEF DESCRIPTION OF THE DRAWINGS

FIGS. 10A–10D show waveforms demonstrating the differences in the transient voltage across the IGBT with and without the resistive protection circuit shown in FIG. 9.

DETAILED DESCRIPTION OF THE PREFERRED EMBODIMENTS

Figure 1:
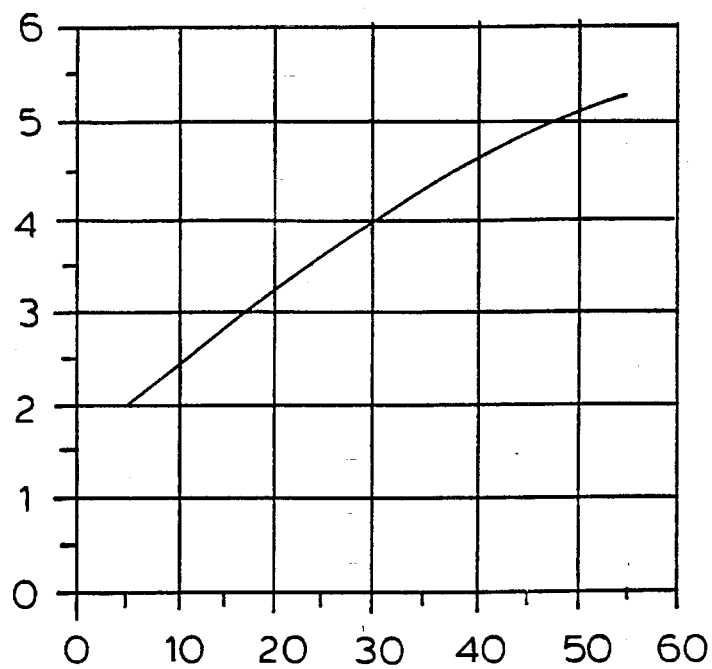
FIG. 1 is a graph showing the tradeoff between permissible short circuit time versus on-state voltage drop across an IGBT.
Figure 4:
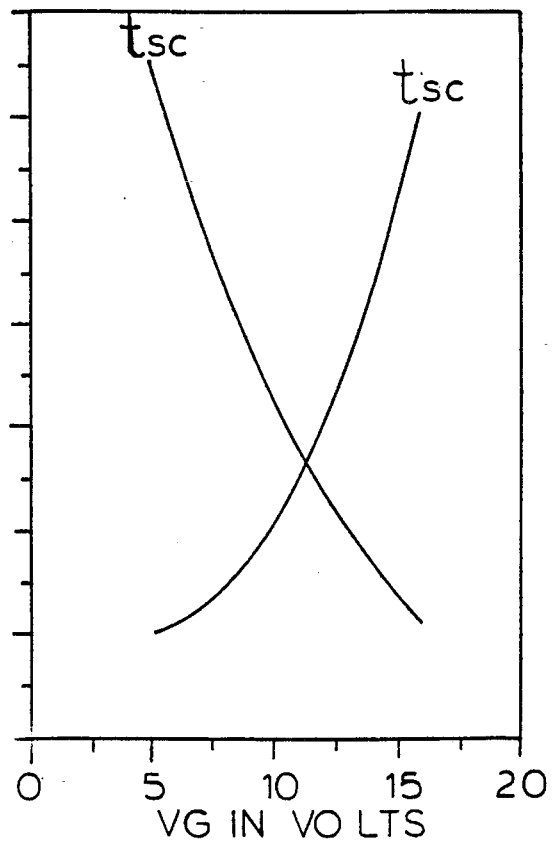
FIG. 4 is a graph showing that the short-circuit withstand capability of an IGBT improves with lower gate voltages.
Figure 2:
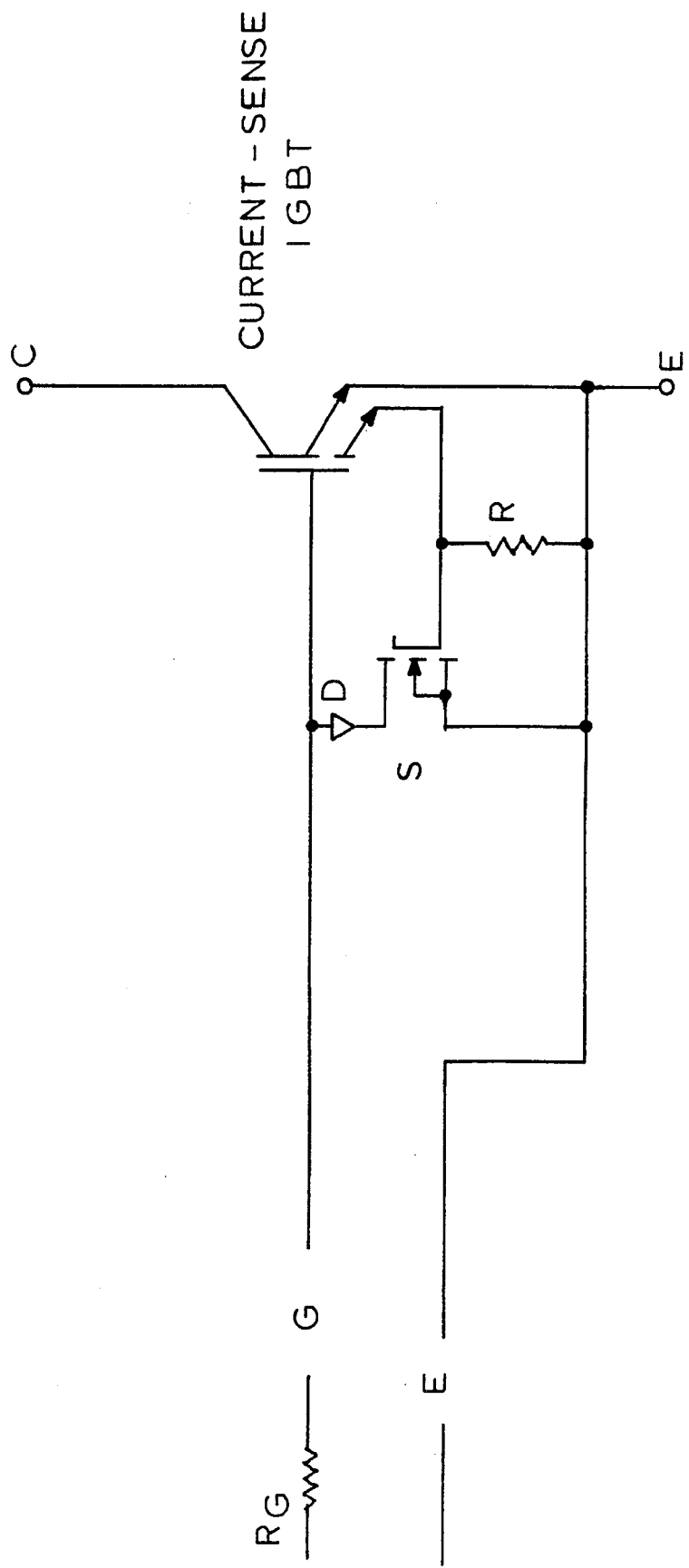
FIG. 2 shows a prior art protection circuit utilizing a current-sense IGBT.
Figure 3:
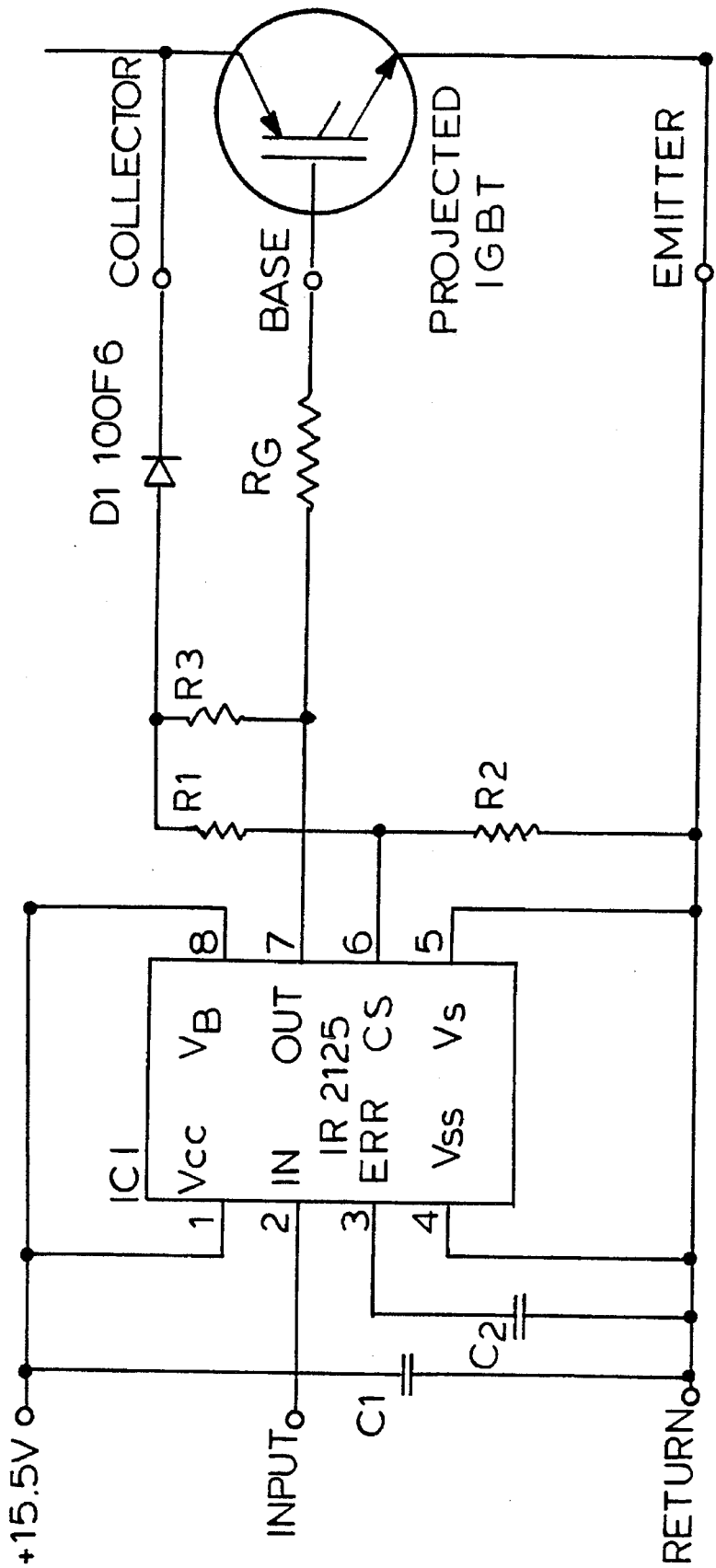
FIG. 3 shows a prior art circuit which uses a power IC to monitor the collector to emitter voltage of the protected IGBT.
Figure 5:
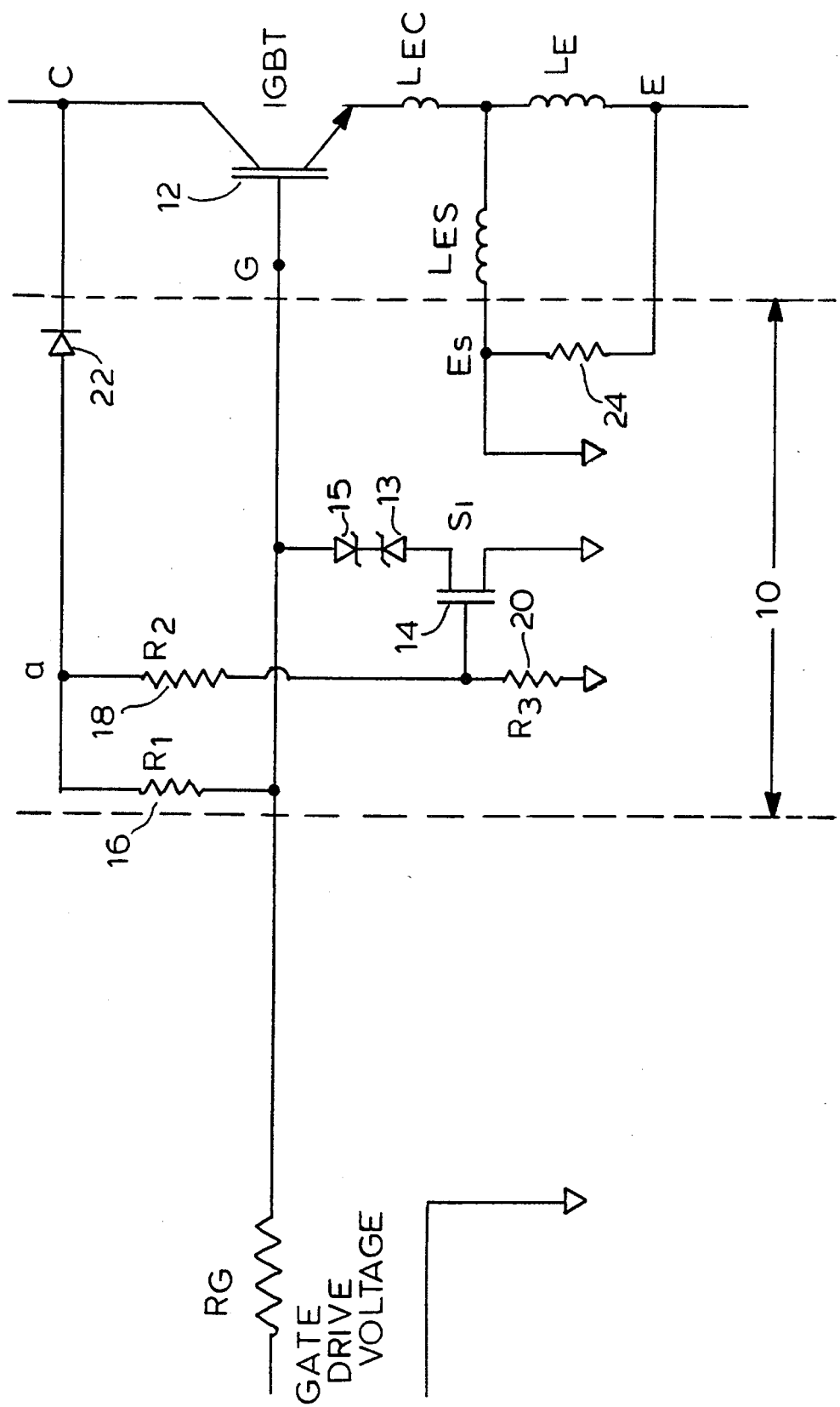
FIG. 5 shows the protection circuit of the present invention where a Zener diode is connected between a MOSFET and a gate of an IGBT.

Referring now to the drawings where like numerals indicate like elements, the circuit of the present invention as shown in FIG. 5 is contained within the dashed lines identified by reference numeral 10. The IGBT to be protected by circuit 10 is identified by reference numeral 12.

Circuit 10 includes a MOSFET 14 with its drain coupled to the gate G of IGBT 12 through opposing Zener diodes 13, 15. The gate of MOSFET 14 is coupled to the gate of IGBT 12 through a potential divider consisting of resistors 16, 18 and 20 having values R1, R2 and R3, respectively. These resistors are selected such that the percentage of the gate voltage applied to MOSFET 14 is ordinarily low enough to avoid turn-on of MOSFET 14. In its off state, MOSFET 14 has no effect on the gate voltage applied to IGBT 12.

Point a, between resistors 16 and 18, is coupled to the collector C of IGBT 12 via a diode 22.

If a fault occurs while IGBT 12 is in conduction, considered to be the worst case, the voltage across it rapidly rises towards the DC rail voltage and diode 22 becomes reverse biased. The gate drive now starts to charge the input capacitance of MOSFET 14 at a rate determined by time constant (R1+R2)C, C being the input capacitance of MOSFET. The potential divider, formed by (R1+R2) and R3, drives MOSFET 14 into conduction. By adjusting the values of the resistors, the time constant can be set to avoid false triggering by switching transients. Zener diode 15 allows for the negative gate bias voltage to be applied.

A resistor 24 is provided for negative feedback in the gate-emitter loop. $L_E$ and $L_{ES}$ are the inherent lead inductances of main emitter and emitter sense connections, respectively. During a fault, a voltage proportional to the fault current di/dt is induced across $L_E$. By inserting resistor 24 between points E and Es, a potential divider is formed across $L_E$. The voltage drop in $L_{ES}$, during fast rise in the fault current, instantaneously reduces the IGBT gate-emitter voltage. This action limits the rate of rise of fault current and lowers its peak value. The value of resistor 24 must be selected carefully in order to minimize its impact on normal switching. Nevertheless, any adverse effects on IGBT switching performance can be easily counterbalanced by adjusting the value of external series gate resistor $R_G$.

Figure 6:
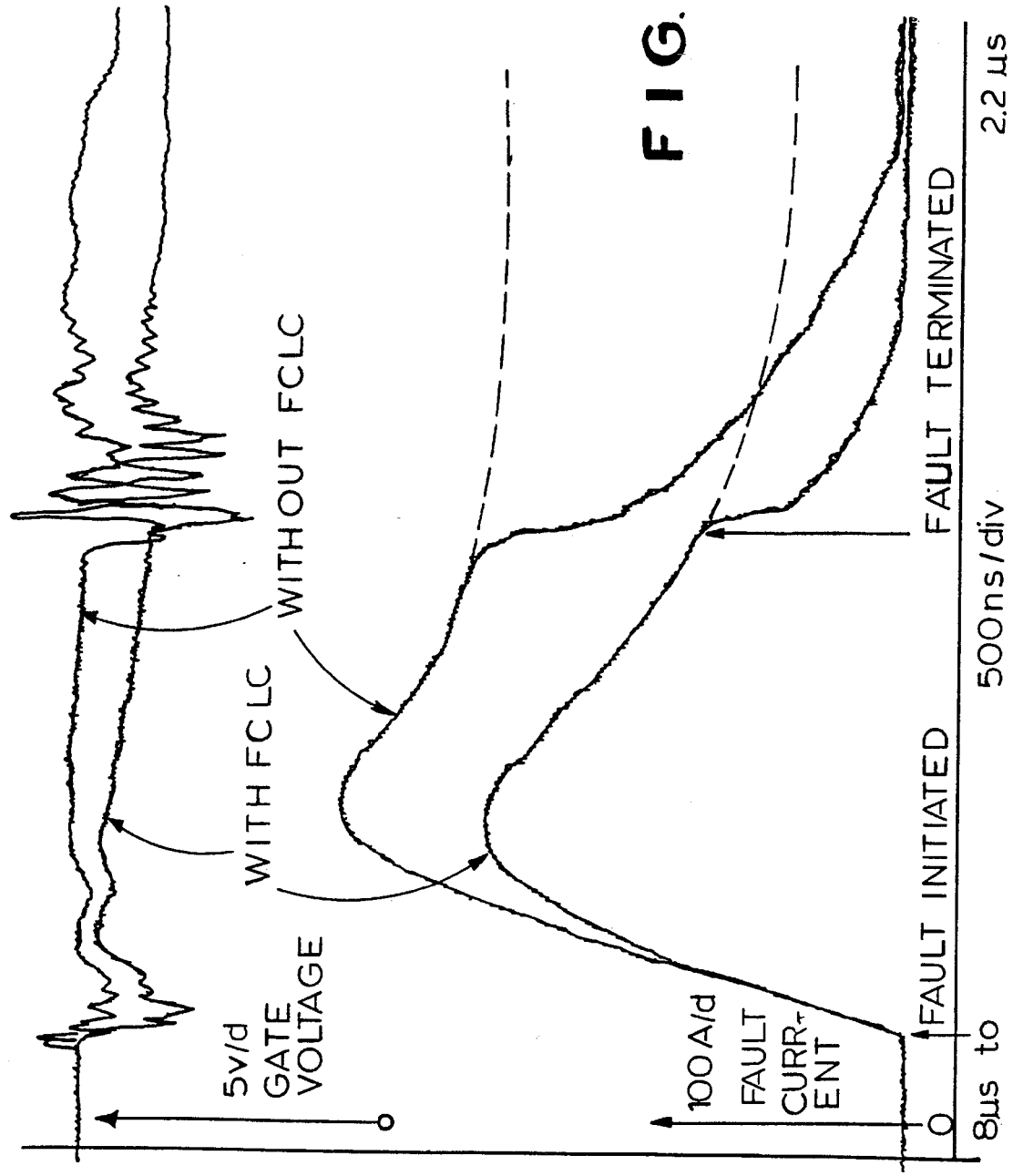
FIG. 6 shows waveforms demonstrating the differences in the magnitudes of fault currents with and without the circuit shown in FIG. 5.

With the MOSFET 14 fully turned on, the IGBT gate is clamped to the Zener voltage of Zener diode 13 (plus a small voltage drop across diode 15 and MOSFET 14). This clamp voltage is kept low enough to limit the fault current to a value specified by the short-circuit-safe-operating-area, SCSOA. If the fault occurs while the device is in conduction, the rise in collector voltage would couple a capacitive current from the collector to the gate. This effect, also known as the "Miller effect", causes the gate voltage to rise well above the normal gate drive voltage and forces a much higher magnitude of fault current through the IGBT. The circuit of the invention minimizes this adverse effect. The waveforms shown in FIG. 6 demonstrate the differences in the magnitudes of the fault currents with and without the circuit of the invention.

If the fault current is of short transient type, the circuit of the present invention advantageously restores the gate voltage and normal device operation continues unimpeded.

Figure 7:
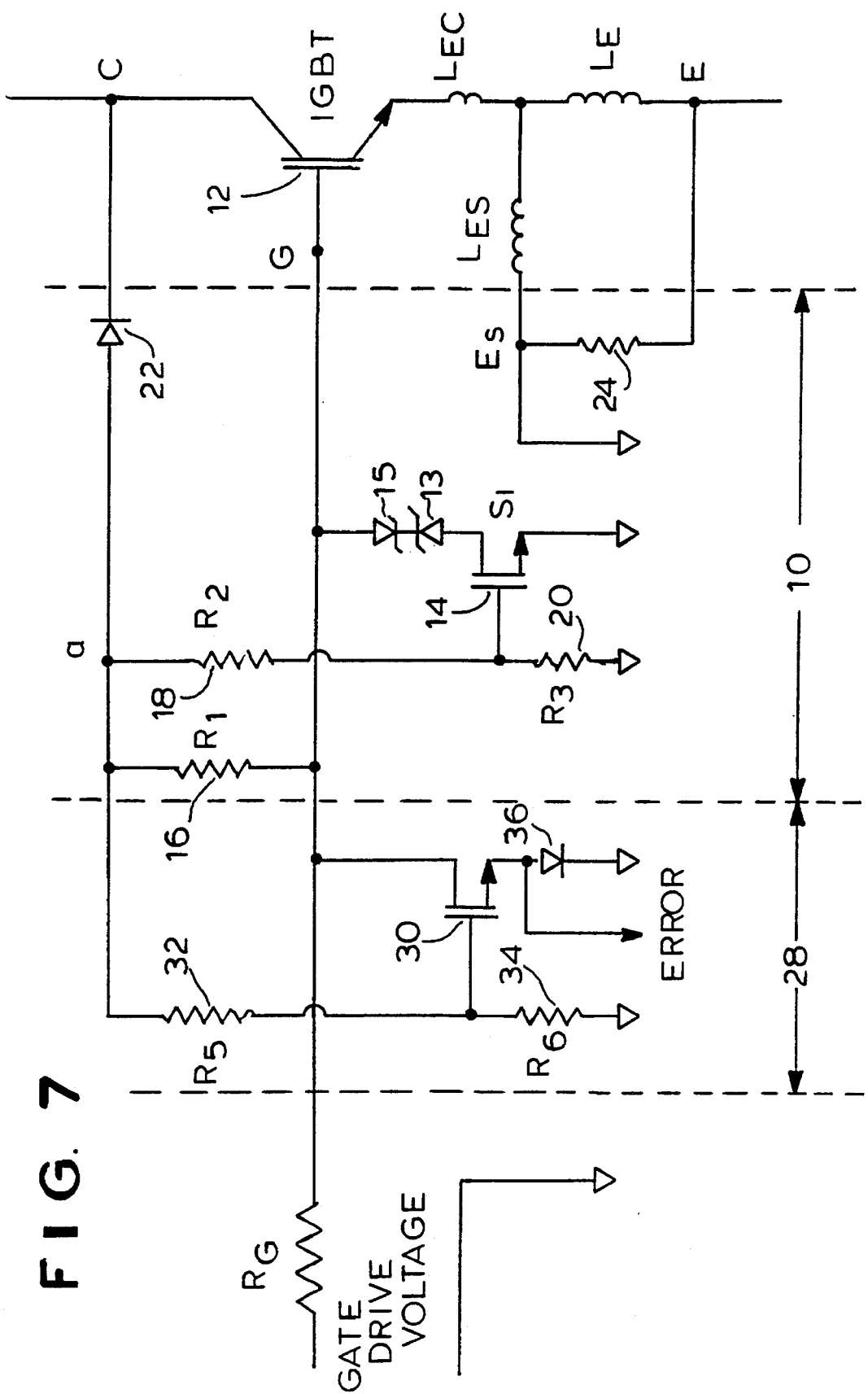
FIG. 7 shows an alternative embodiment of the invention utilizing an additional MOSFET to turn the IGBT off completely if the short circuit condition lasts longer than a predetermined time interval.

An alternative embodiment of the present invention is shown in FIG. 7. In this embodiment, additional circuitry 28 consisting of an additional MOSFET 30 and a pair of voltage divider resistors 32, 34 (having resistances of R5 and R6, respectively) are provided. MOSFET 30 turns IGBT 12 off completely if the fault lasts longer than a predetermined time interval as set by R1, R5, R6 and C2 (C2 being the gate capacitance of MOSFET 30). In such a case, the voltage drop across the PN junction of a diode 36 provided at the source of MOSFET 30 serves as an error flag, indicating fault. It should be noted that, when MOSFETs 14 and 30 are on, the dissipation in the gate driver is limited by the external series gate resister $R_G$.

Figure 8:
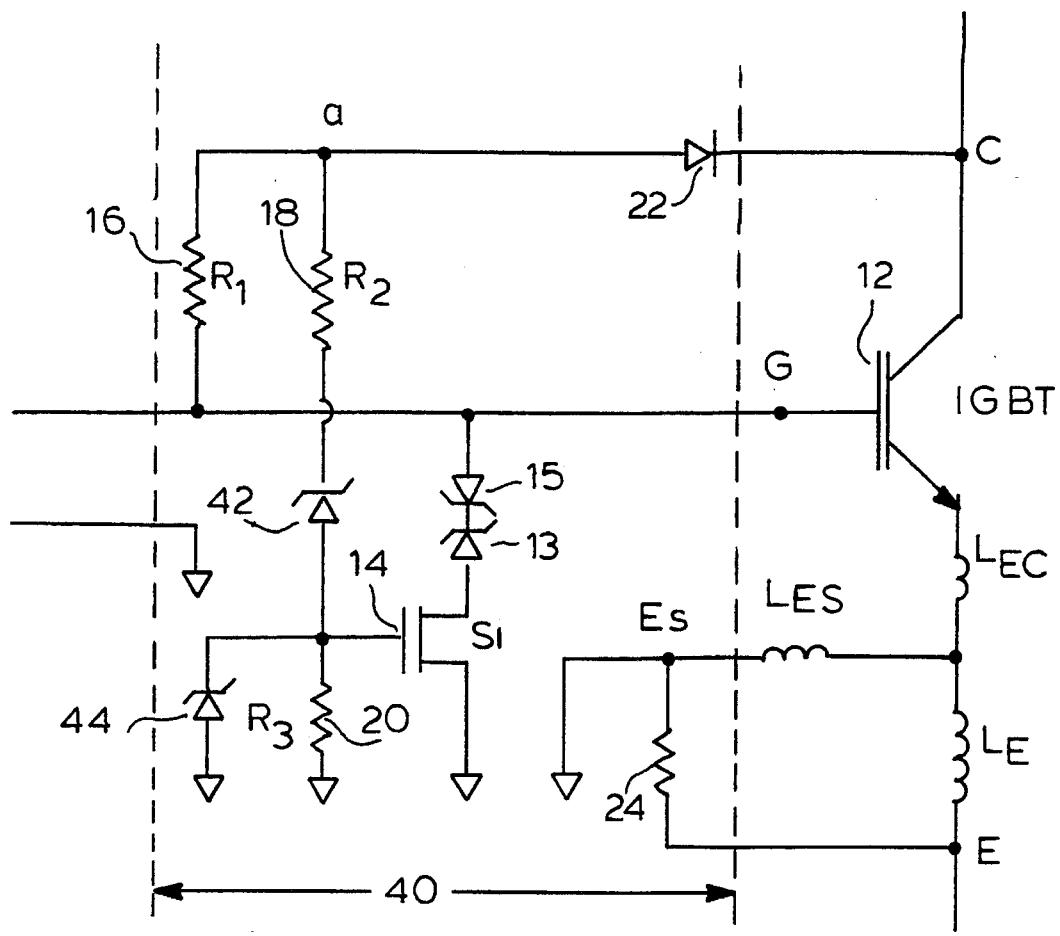
FIG. 8 shows another alternative embodiment of the invention in which a Zener diode is added to make the circuit more or less insensitive to variations in the on-state voltage drop of the IGBT and eliminate the need to select the MOSFET according to its gate-threshold voltage.

A further embodiment of the invention is shown in FIG. 8. The circuit of this embodiment, identified by reference numeral 40, requires two additional Zener diodes (identified by reference numerals 42 and 44), but eliminates the need to select MOSFET 14 according to its gate-threshold voltage. Thus, in the circuit of FIG. 5, MOSFET 14 must be selected to turn on above a particular voltage, that voltage being a fraction of the short circuit voltage at the collector of the IGBT 12. During normal conduction, the voltage at the collector of IGBT 12 depends upon the on-state voltage drop of the particular IGBT. However, by adding Zener diode 42 (and its associated voltage drop) as shown in FIG. 8, the voltage swing at the base of MOSFET 14 is increased such that, in the absence of a short circuit, only a fraction of a volt is present at the base of MOSFET 14. Thus, the circuit is less sensitive to variations in the on-state voltage drop of IGBT 12. Zener diode 44 is provided to protect the gate of MOSFET 14.

Figure 9:
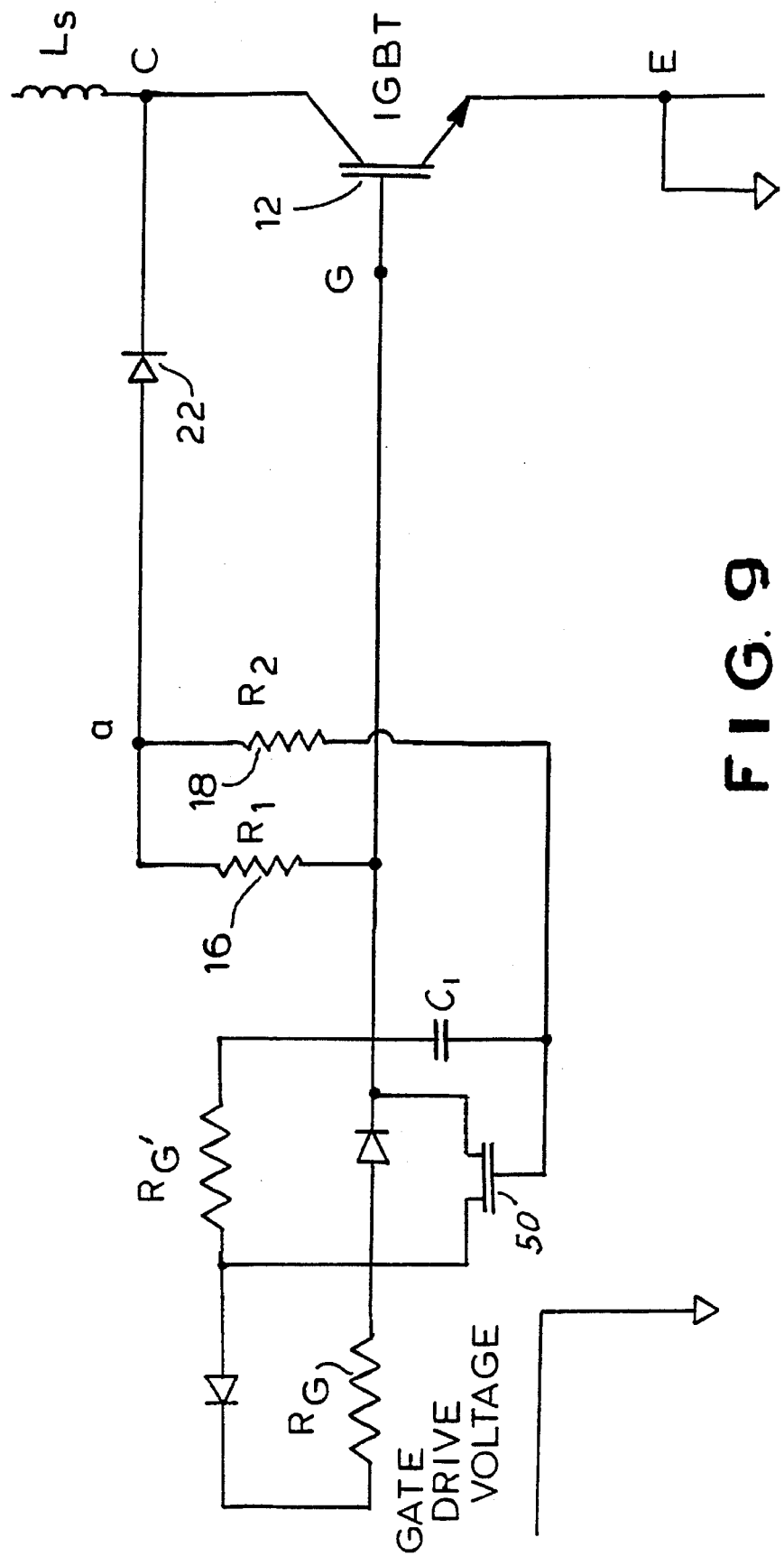
FIG. 9 shows a resistive circuit for slowing the rate of turn-off of the IGBT during a short circuit condition to protect the IGBT from voltage transients.

FIG. 9 shows a circuit for protecting the IGBT against destructive voltage transients during fault current shut off. The circuit shown in FIG. 9 utilizes a P-channel MOSFET 50 to switch-in a resistor $R_G'$ in series with the IGBT gate resistor $R_G$ upon the occurrence of a fault while the IGBT is in conduction, thereby slowing the rate of fall of fault current.

Initially, when IGBT 12 is in its off state, P-channel MOSFET 50 is turned off. During normal turn on, a step rise in voltage is applied to the gate of IGBT 12 through $R_G$ and the inherent body diode of P-channel MOSFET 50. As $V_{CE}$, after normal turn-on delay period, drops to its low on-state level, diode 22 is forward biased and input capacitance of P-channel MOSFET 50 starts to charge up. During normal conduction, therefore, P-channel MOSFET 50 remains gated on.

During normal turn off operation, the gate drive output voltage is switched to its low state. The gate capacitance of P-channel MOSFET 50 begins to discharge. The values of C1, R1 and R2 are selected such that the P-channel MOSFET is kept on, at least until the IGBT turn off is completed (for example 1 µs). Therefore, the IGBT turn off losses are not affected.

When a fault occurs during normal conduction, diode 22 goes into blocking mode and the input capacitance of P-channel MOSFET 50 starts to discharge through resistors R1 and R2. The MOSFET is turned off as its gate voltage drops below the threshold value. Thereafter, the $V_{GE}$ rate of fall is reduced significantly as the discharge is now forced to take place through $R_G'$. The fault current fall rate is decreased accordingly. Note that if the IGBT is turned off while the MOSFET is still on, the circuit will not be effective, since $R_G'$ is bypassed. This consideration places an upper limit on the discharge time of the MOSFET (e.g. 5 µs).

Ordinarily, upon the occurrence of a fault, the current through the IGBT shoots up initially due to the Miller effect on the gate voltage, and then settles down once the Miller effect is diminished. The Miller effect can be filtered out by bypassing $R_G$ with a diode, as shown in dashed lines in FIG. 9, thus clamping the IGBT gate voltage to the gate drive output.

FIGS. 10A–10D show the short circuit waveforms for the IGBT with and without the resistive protection circuit shown in FIG. 9.

Figure 11:
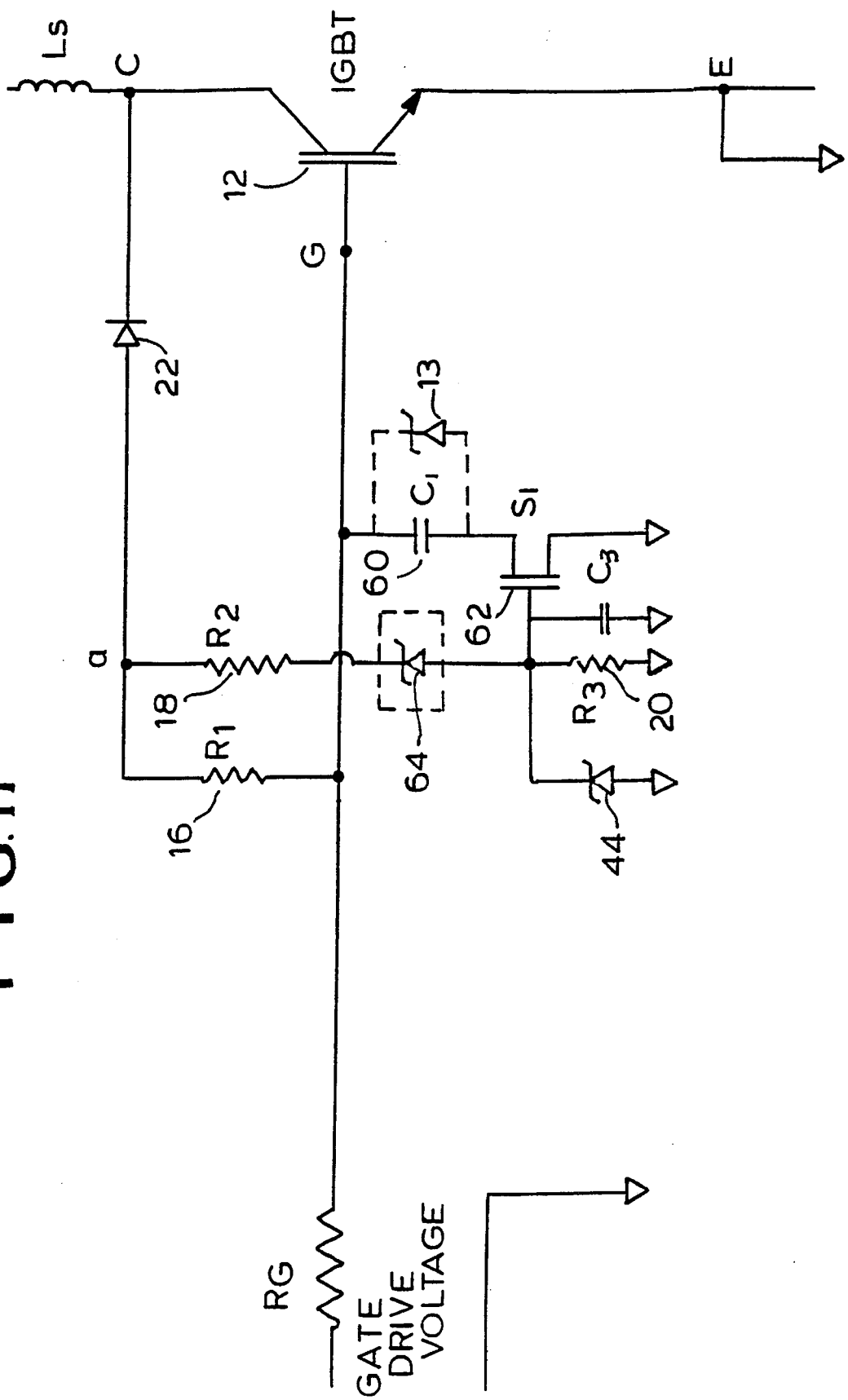
FIG. 11 shows a capacitive circuit for slowing the rate of turn-off of the IGBT during a short circuit condition to protect the IGBT from voltage transients.

An alternative circuit for protecting the IGBT against fault current shut off voltage transients is shown in FIG. 11, in which a capacitor 60, connected between the drain of a N-channel MOSFET 62 and the gate G of the IGBT 12, is switched-in in parallel with the IGBT gate input capacitance during a short circuit condition.

During normal turn-on of IGBT 12 after the normal turn-on delay, $V_{CE}$ of the IGBT drops to its low on-state level and diode 22 is forward biased. The MOSFET gate charge time constant is adjusted by selecting appropriate values for $R_1, R_2, R_3$ and $C_3$, so that the MOSFET gate is not turned on before IGBT 12 is turned on (for example, 1 µs). Thus, the MOSFET is in its off state during the conduction period. In situations where an IGBT with a high $V_{CE(on)}$ is to be protected, a Zener diode 64 (shown in dashed lines in FIG. 11) is preferably included between $R_2$ and $R_3$ to prevent false triggering of MOSFET 62.

When a fault occurs, diode 22 becomes reverse biased and the N-channel MOSFET gate input capacitance is charged by the gate drive power, through the potential divider formed by $(R_1+R_2)+R_3$, driving the MOSFET into conduction. When N-channel MOSFET 62 turns on, capacitor 60 is switched-in in parallel with the input capacitance of IGBT 14. A drop occurs in the IGBT gate voltage because some charge is removed to charge the capacitor 60 which was initially charged to the off-bias voltage. This in turns lowers the short circuit current momentarily, thereby reducing the energy losses during the short circuit period. The discharge time constant of IGBT 12 is increased since it now includes capacitor 60 in parallel with the IGBT input capacitance. As a result, the rate of fault current turn off, di/dt, is slowed and the transient voltage is substantially reduced.

Figure 12A:
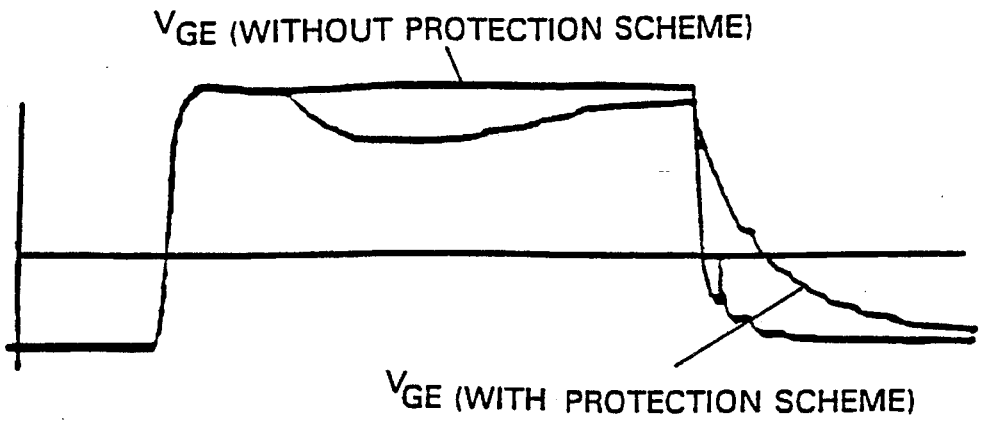
FIGS. 12A–12C show the short circuit waveforms demonstrating the differences in transient voltage across the IGBT with and without the capacitive protection circuit shown in FIG. 11.
Figure 12B:
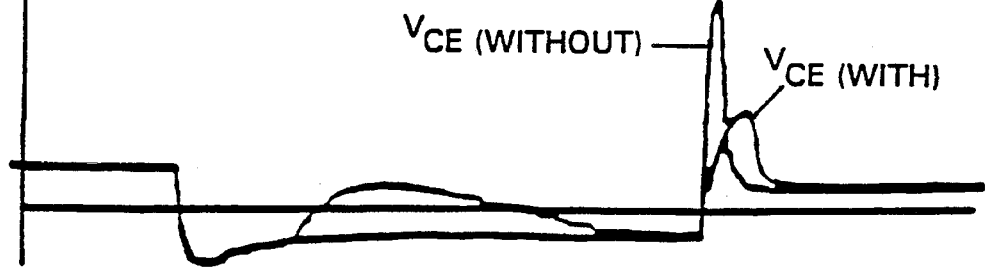
Figure 12C:
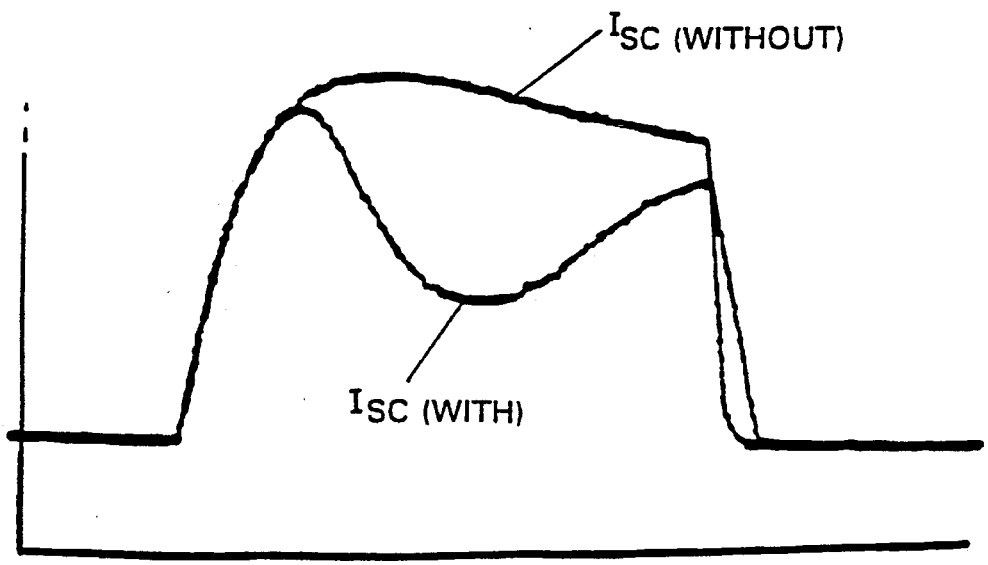

FIGS. 12A–12C show the short circuit waveforms for the IGBT with and without the capacitive protection circuit of FIG. 11.

It should be noted that when the IGBT gate drive is switched to its off state to turn the IGBT off during normal operation (i.e., in the absence of a fault), N-channel MOSFET 62 remains turned off, such that capacitor 60 has no effect on the circuit. Thus, normal switching operation is not affected by the inclusion of capacitor 60 in the protection circuit.

The functional usefulness of the circuit of FIG. 11 can be increased by the simple addition of a diode 13 (which is the same as Zener diode 13 shown in FIG. 5) connected in parallel across capacitor 60 between the drain of the N-channel MOSFET and the gate G of the IGBT 12. As in the circuit of FIG. 5, diode 13 limits the fault current amplitude through the IGBT. Thus, the circuit as shown in FIG. 11 with diode 13 protects against destructive turn-off voltage transients and limits a fault current amplitude to a predetermined safe value.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A circuit for protecting an IGBT against voltage transients occurring during fault shut-off, the IGBT having a collector, an emitter, and a gate, the circuit comprising:

a diode connected to the collector of the IGBT and oriented so as to be rendered non-conductive during a short circuit condition when the voltage at the collector of the IGBT rises;

a gate drive resistor connected to the gate of the IGBT;

an additional resistor connectable in series with the gate drive resistor;

a P-channel MOSFET having a gate, a drain, a source, and an input capacitance, the drain and source of the P-channel MOSFET being connected across the additional resistor;

two series resistors coupled in parallel with the input capacitance of the P-channel MOSFET; and a diode coupled at one end at a point between the series resistors and at the other end to the collector of the IGBT, the diode being oriented so as to be rendered non-conductive when the voltage at the collector of the IGBT rises, such that, during a short circuit condition when the voltage at the collector of the IGBT rises and the diode becomes non-conductive, the input capacitance of the P-channel MOSFET discharges through both of the two series resistors, and the voltage at the gate of the P-channel MOSFET decreases, thereby turning off the P-channel MOSFET and electrically connecting the additional resistor in series with the gate drive resistor to slow the rate of turn-off of the IGBT.

2. A circuit as recited in claim 1, further comprising a diode connected across the gate drive resistor to clamp the IGBT gate voltage to the gate drive output voltage.

3. A circuit for protecting an IGBT against voltage transients occurring during fault shut-off, the IGBT having a collector, an emitter, a gate and an input capacitance, the circuit comprising:

a gate drive resistor connected to the gate of the IGBT;

an additional capacitor connectable in parallel with the input capacitance of the IGBT;

a N-channel MOSFET having a gate, a drain and a source, the additional capacitor being connected between the drain of the N-channel MOSFET and the gate of the IGBT, the source of the N-channel MOSFET being connected to the emitter of the IGBT;

a potential divider coupled between the gate of the IGBT and the gate of the N-channel MOSFET; and a diode coupled at one end to the potential divider and at the other end to the collector of the IGBT, the diode being oriented so as to be rendered non-conductive when the voltage at the collector of the IGBT rises, such that, during a short circuit condition when the voltage at the collector of the IGBT rises and the diode becomes non-conductive, an increased voltage is generated at the gate of the N-channel MOSFET as current flowing through the gate drive resistor is prevented from passing through the diode and is diverted to the potential divider, thereby applying an increased voltage to the gate of the N-channel MOSFET, thereby turning on the N-channel MOSFET and electrically connecting the additional capacitor in parallel with the input capacitance of the IGBT to slow the rate of turn-off of the IGBT.

4. A circuit as recited in claim 3, further comprising a voltage clamping device coupled in parallel with the additional capacitor, the voltage clamping device clamping the voltage of the gate of the IGBT to a predetermined voltage when the N-channel MOSFET is turned on during a short circuit condition, thereby limiting fault current amplitude.

5. A circuit as recited in claim 4, wherein the voltage clamping device comprises a Zener diode.

6. A method for protecting an IGBT against voltage transients occurring during fault shut-off, the IGBT having a collector, an emitter, a gate and an input capacitance, the method comprising the steps of:

sensing a short circuit condition;

connecting an additional capacitor in parallel with the input capacitance of the IGBT, by turning on a N-channel MOSFET coupled in series with the additional capacitor, to decrease the rate of fall of voltage at the gate of the IGBT during the short circuit condition; and clamping the voltage of the gate of the IGBT to a predetermined voltage when the N-channel MOSFET is turned on during a short circuit condition.

* * * * *